(12) United States Patent
Solodovnik et al.

(10) Patent No.: US 11,469,754 B2
(45) Date of Patent: Oct. 11, 2022

(54) ACTIVE VOLTAGE BALANCING FOR POWER MODULATION DEVICE

(71) Applicant: The Boeing Company, Chicago, IL (US)

(72) Inventors: Eugene V. Solodovnik, Kenmore, WA (US); Kamiar J. Karimi, Kirkland, WA (US); Shengyi Liu, Sammamish, WA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 17/450,047

(22) Filed: Oct. 5, 2021

(65) Prior Publication Data
US 2022/0216865 A1    Jul. 7, 2022

Related U.S. Application Data

(60) Provisional application No. 63/133,976, filed on Jan. 5, 2021.

(51) Int. Cl.
H03K 17/082 (2006.01)
H03K 17/22 (2006.01)
H02J 1/10 (2006.01)

(52) U.S. Cl.
CPC ............ *H03K 17/223* (2013.01); *H02J 1/106* (2020.01)

(58) Field of Classification Search
None
See application file for complete search history.

(56) References Cited

U.S. PATENT DOCUMENTS 4,487,458 A * 12/1984 Janutka ................ H03K 17/102
327/575
9,595,950 B1 * 3/2017 Seok .................... H03K 17/107
(Continued)

FOREIGN PATENT DOCUMENTS

EP          2797215 A1    10/2014
WO    2011147055 A1    12/2011

OTHER PUBLICATIONS

Vechalapu, K. et al., "Performance Evaluation of Series Connected 1700V SiC MOSFET Devices," Proceedings of the 2015 IEEE 3rd Workshop on Wide Bandgap Power Devices and Applications (WiPDA), Nov. 2, 2015, Blacksburg, Virginia, 8 pages.
(Continued)

*Primary Examiner* — Jeffery S Zweizig
(74) *Attorney, Agent, or Firm* — Alleman Hall Creasman & Tuttle LLP

(57) ABSTRACT

A system including a power modulation device and an active voltage balancing system is provided. The power modulation device includes first and second semiconductor switches in series. The active voltage balancing system includes a differential voltage logic configured to detect a voltage difference between the first and second semiconductor switches and edge capture logic configured to detect a time difference between when the first and second semiconductor switches are switched. The active voltage balancing system further includes a micro-controller configured to output first and second gate drive signals to drive the first and second semiconductor switches. The micro-controller is configured to tune the first and second gate drive signals based on the voltage difference to compensate for voltage imbalance and the time difference to compensate for drive signal asymmetry to actively balance a voltage between the first and second semiconductor switches.

20 Claims, 7 Drawing Sheets

(56) References Cited

U.S. PATENT DOCUMENTS

| 9,843,293 B1* | 12/2017 | Wagh | H03F 1/0261 |
| 2021/0399724 A1* | 12/2021 | Li | H03K 17/04206 |

OTHER PUBLICATIONS

Ji, S. et al., "Active Voltage Balancing Control for 10kV Three-level Converter Using Series-Connected HV-IGBTs," Proceedings of the 2016 IEEE Applied Power Electronics Conference and Exposition (APEC), Mar. 20, 2016, Long Beach, California, 6 pages.

Palmer, P. et al., "IGBT Series Connection under Active Voltage Control with Temporary Clamp," Proceedings of IECON 2012—38th Annual Conference on IEEE Industrial Electronics Society, Oct. 25, 2012, Montreal, Canada, 6 pages.

Palmer, P. et al., "SiC MOSFETs Connected in Series with Active Voltage Control," Proceedings of 2015 IEEE 3rd Workshop on Wide Bandgap Power Devices and Applications (WiPDA), Nov. 2, 2015, Blacksburg, Virginia, 6 pages.

European Patent Office, Extended European Search Report Issued in Application No. 21217972.5, dated May 24, 2022, Germany, 7 pages.

* cited by examiner

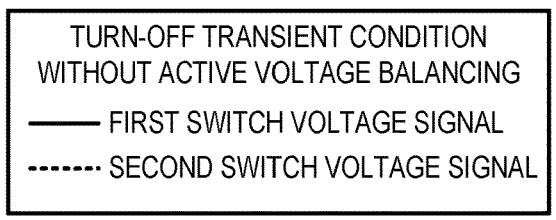
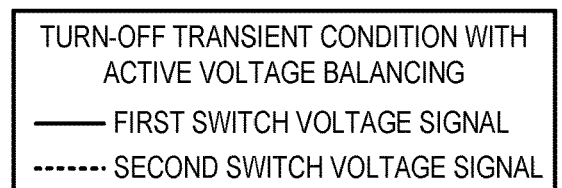
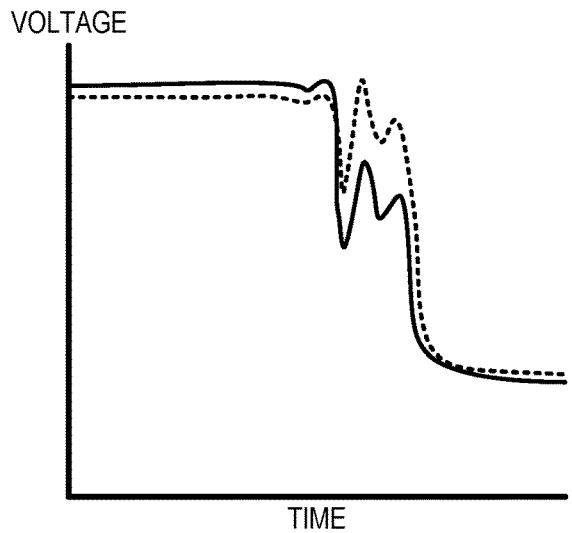
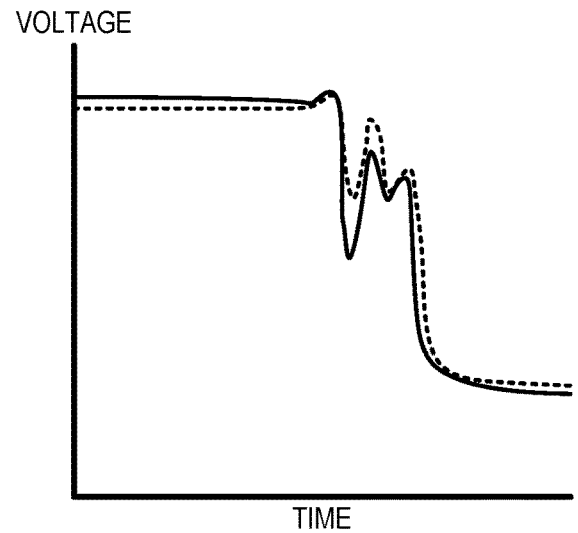
FIG. 7A
FIG. 7B
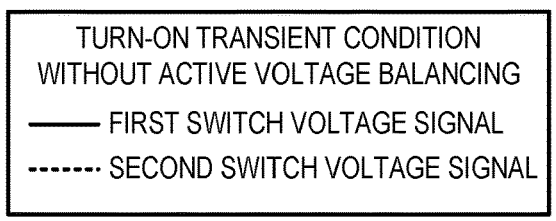
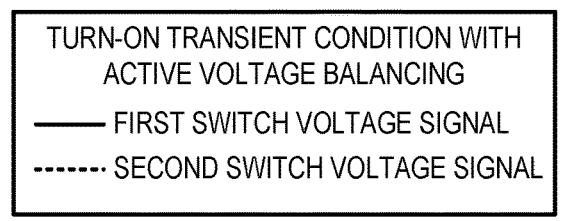
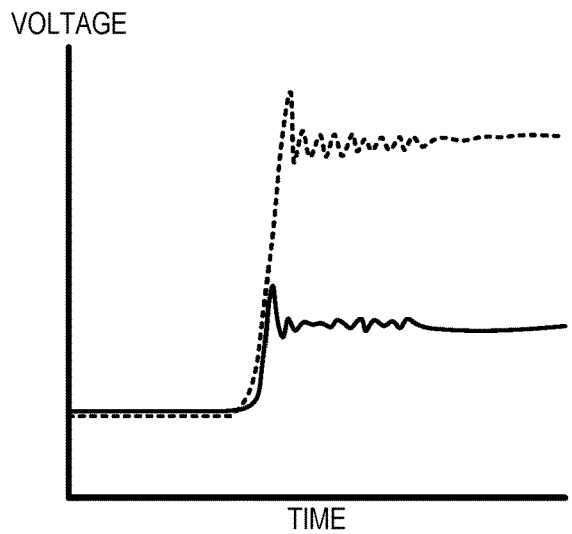
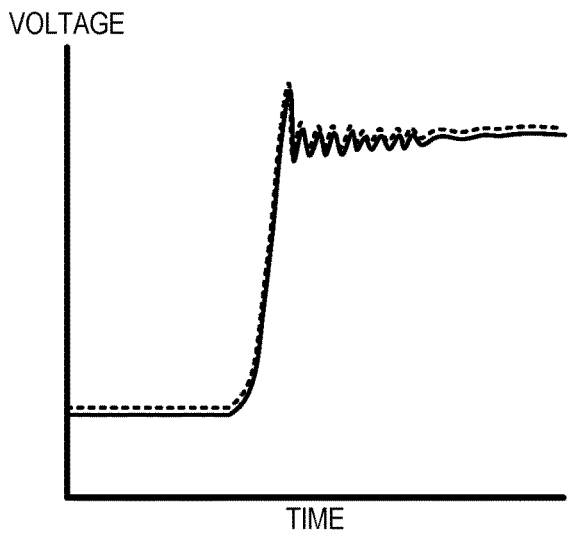
FIG. 7C
FIG. 7D

ACTIVE VOLTAGE BALANCING FOR POWER MODULATION DEVICE

CROSS REFERENCE TO RELATED APPLICATIONS

This application claims priority to U.S. patent application Ser. No. 63/133,976, filed Jan. 5, 2021, the entirety of which is hereby incorporated herein by reference for all purposes.

FIELD

This disclosure relates generally to power modulation devices, and more specifically, to actively balancing a voltage distribution across a plurality of semiconductor switches connected in series in a power modulation device.

BACKGROUND

In various applications, power modulation devices are employed in electric drive systems having relatively high voltage and high power capabilities for driving large electrical loads. The voltage limits of semiconductor switches that are typically employed in a power modulation device of such an electric drive system are not sufficiently high to individually support the high voltage requirement to the large electrical load. As such, multiple semiconductor switches can be connected in series such that each semiconductor switch shares a portion of the high voltage requirement. However, due to variances in physical parameters of the individual semiconductor switches as a result of manufacturing, circuit design, and/or environmental effects, a voltage imbalance may occur among series-connected semiconductor switches. Such a voltage imbalance may result in accelerated degradation and de-rated performance of the semiconductor switches.

SUMMARY

To address the above issues, according to one aspect of the present disclosure, a system comprising a power modulation device and an active voltage balancing system is provided. The power modulation device includes a first semiconductor switch and a second semiconductor switch in series. The active voltage balancing system includes differential voltage logic configured to detect a voltage difference between the first and second semiconductor switches and edge capture logic configured to detect a time difference between when the first and second semiconductor switches are switched. The active voltage balancing system further includes a micro-controller configured to output first and second gate drive signals to drive the first and second semiconductor switches. The micro-controller is configured to tune the first and second gate drive signals based on the voltage difference to compensate for voltage imbalance and the time difference to compensate for drive signal asymmetry to actively balance a voltage between the first and second semiconductor switches.

The features and functions that have been discussed can be achieved independently in various embodiments or may be combined in yet other embodiments, further details of which can be seen with reference to the following description and drawings.

BRIEF DESCRIPTION OF THE DRAWINGS

FIGS. 7A-7D are graphs showing semiconductor switching with and without the active voltage balancing techniques described herein.

DETAILED DESCRIPTION

Figure 1:
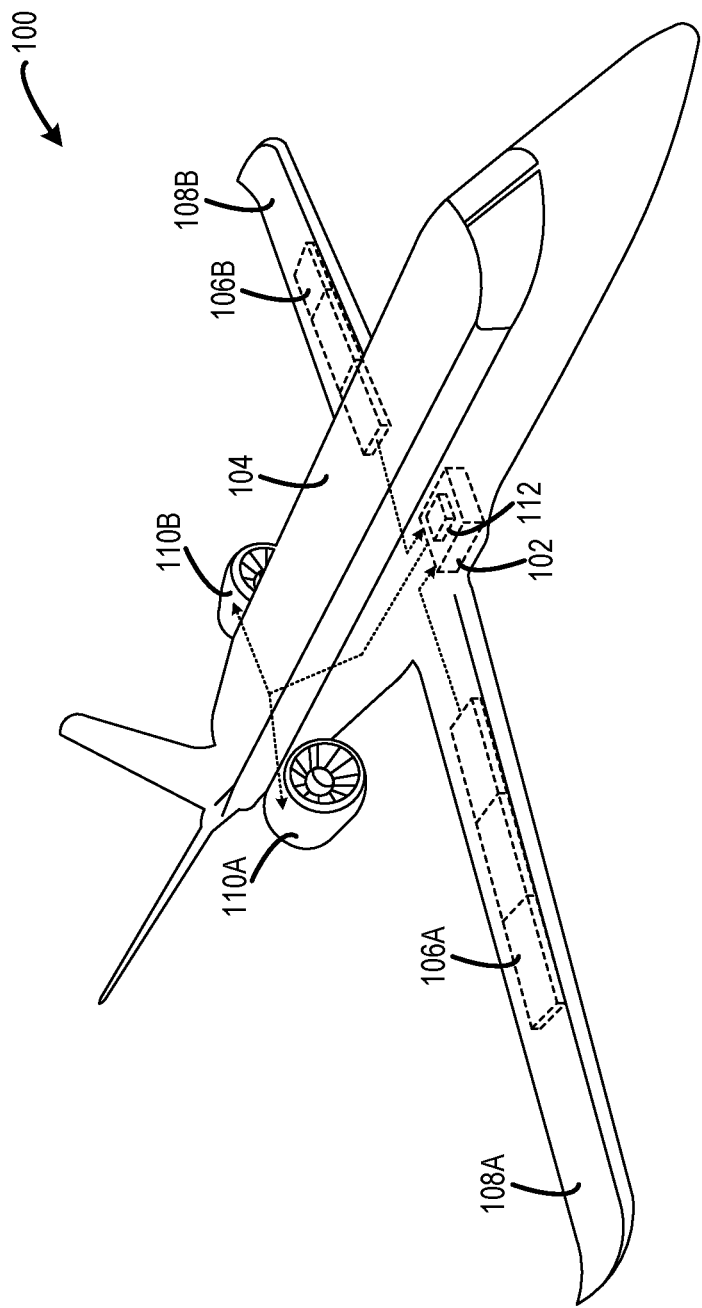
FIG. 1 schematically shows an example embodiment of an aircraft that includes an electric drive system.

Electric drive systems that include power modulation devices may be implemented in numerous applications to drive large electrical loads, such as vehicle applications including automobile, watercraft, and aircraft applications. For aircraft applications, as one example, an electric drive system may be employed to drive a propulsion system of an all-electric or hybrid electric aircraft. FIG. 1 schematically shows an example embodiment of an aircraft 100 including high voltage (~kV) and high power (~MW) capability electric drive system 102. The electric drive system 102 is positioned in a fuselage 104 of the aircraft 100. The electric drive system 102 is configured to draw power from a pair of batteries 106A, 106B positioned in wings 108A, 108B that extend from the fuselage 104 of the aircraft 100. Note that the depicted location of the batteries 106A, 106B is non-limiting and other battery locations are possible. For example, the batteries may be positioned in a lower portion of the fuselage. The electric drive system 102 is configured to provide electrical power to a pair of propulsion motors 110A, 110B. The electric drive system 102 includes a power modulation device 112 that is configured to modulate electrical power received from the pair of batteries 106A, 106B to a form that is suitable to drive the pair of propulsion motors 110A, 110B. Due to the high voltage and high power requirements of the propulsion motors, the power modulation device 112 may include a plurality of semiconductor switches in series. The power modulation device 112 may include virtually any number of semiconductor switches in series based on the power/voltage capacity of the individual semiconductor switches and the overall power/voltage requirements of the aircraft 100. In some embodiments, the power modulation device 112 may include a plurality of branches connected in parallel and each branch may include one or more switches. For branches including two or more switches, the switches are connected in series.

The above described electric drive system is a non-limiting example of an electric drive system including a power modulation device having high power and high voltage capabilities that includes a plurality of semiconductor switches that are configured to cooperatively share a portion of the high voltage requirement of the electric drive system. While the example electric drive system is described herein as driving a pair of propulsion motors, in some embodiments, the electric drive system may be configured to drive more than two propulsion motors and/or one more non-propulsive motor drives (e.g., engine starter, air compressor, hydraulic pump). While the example electric drive system is described herein with reference to aircraft applications, this is in no way limiting. The disclosed electric drive systems may be used in any other application, including non-aircraft vehicle applications and non-vehicle applications.

Figure 2:
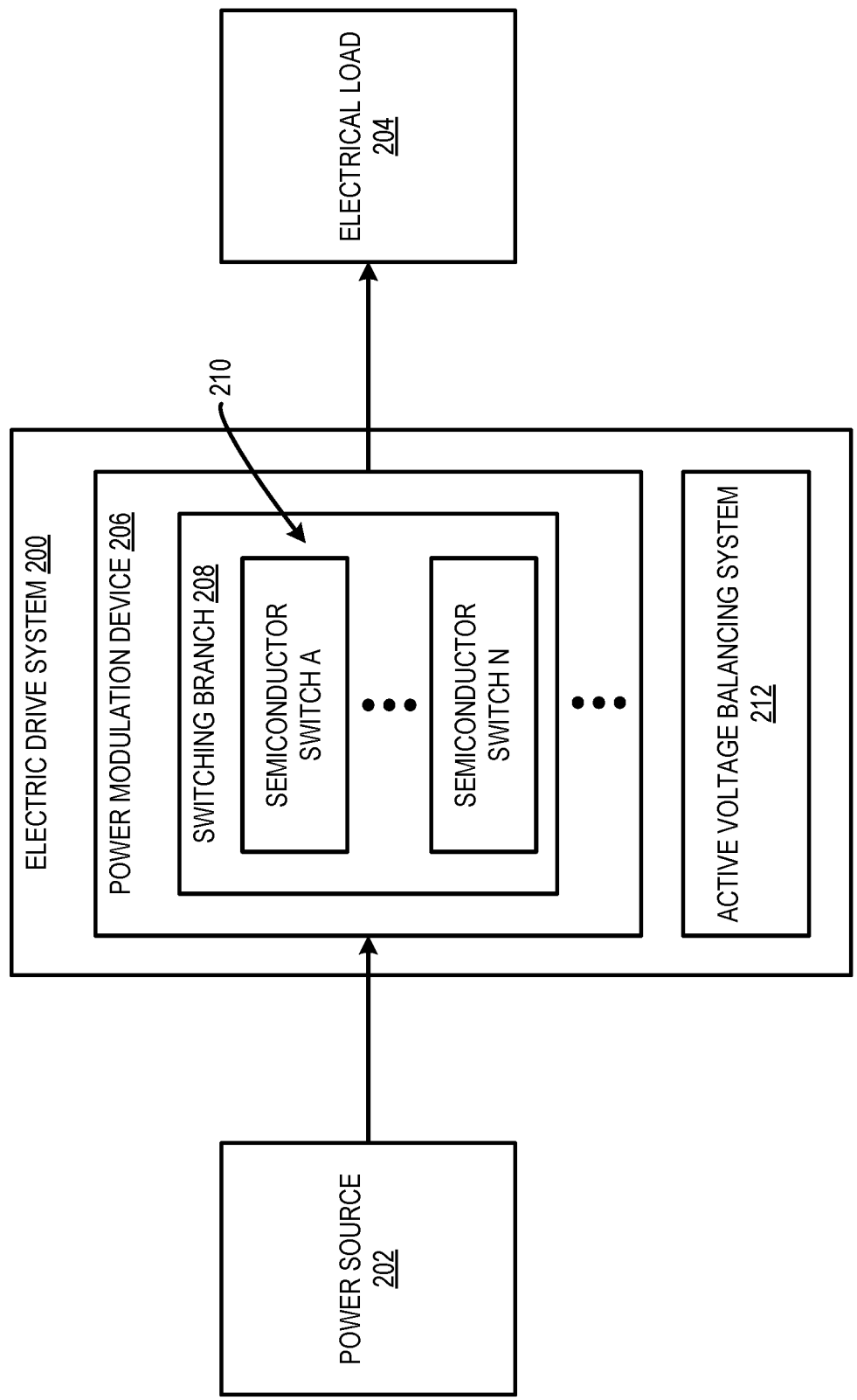
FIG. 2 schematically shows an example electric drive system.

FIG. 2 schematically shows an example embodiment of an electric drive system 200. For example, the electric drive system 200 may be representative of the electric drive system 102 shown in FIG. 1. The electric drive system 200 is configured to draw electrical power from a power source 202 and drive an electrical load 204. The power source 202 may take any suitable form. In some examples, the power source 202 may include an alternating current (AC) power source. In other examples, the power source 202 may include a direct current (DC) power source. Additionally, the electrical load 204 may take any suitable form. While the electrical load is primarily described herein with reference to a high power and high voltage electrical motor, this is in no way limiting.

The electric drive system 200 includes a power modulation device 206 configured to draw electrical power from the power source 202 and modulate the electrical power to a form that is suitable to drive the electrical load 204. The power modulation device 206 may take any suitable form. Non-limiting examples of such power modulation devices include inverters and converters. The power modulation device 206 includes one or more switching branches 208. Each switching branch 208 includes a plurality of semiconductor switches (e.g., 1-N) 210 electrically connected in series. Each switching branch 208 may include any suitable number of semiconductor switches. In embodiments that include a plurality of switching branches, the switching branches are electrically connected in parallel. The total number of switching branches, and correspondingly the total number of semiconductor switches of the power modulation device 206, may depend on the voltage and power capabilities of the individual semiconductor switches such that the total number of semiconductor switches cooperatively share a voltage requirement of the electrical load 204. As one example, an electric drive system for a 3-phase motor may include three switching branches that makes up a 3-phase inverter. As another example, an electric drive system for a 4-phase motor may include 4 switching branches that make up a 4-phase inverter. Each of these switching branches may include one or more switches. For switching branches including two or more switches, the switches are connected in series. Note that with a DC source input, the electric drive system is an inverter (DC/AC converter). In embodiments where the input is AC, then the electric drive is an AC/AC converter. The principles described herein apply to both DC/AC or AC/AC converters, as well as other types of power modulation devices.

The electric drive system 200 includes an active voltage balancing system 212 configured to actively balance a voltage distribution across the plurality of semiconductor switches 210 in series within a branch of the power modulation device 206. As used herein, actively balancing the voltage distribution across the plurality of semiconductor switches in series within a branch means tuning drive signals for driving the semiconductor switches to reduce a voltage difference between the voltage across the individual switches, such that ideally (but not necessarily) the voltages across each individual semiconductor switch are equal to one another. Additionally, actively balancing the voltage distribution across the plurality of semiconductor switches in series within a branch means tuning the drive signals to reduce a time difference, such that ideally (but not necessarily) the switches switch at the same time. In particular, the active voltage balancing system 212 is configured to detect voltage difference(s) between the plurality of semiconductor switches and tune gate drive signals for switching the semiconductor switches based on the voltage difference(s) to compensate for voltage imbalance among the plurality of semiconductor switches. The active voltage balancing system 212 is further configured to detect a time difference between when the semiconductor switches are switched and tune the gate drive signals, based on the time difference, to compensate for drive signal asymmetry between the plurality of semiconductor switches. By performing these compensation techniques, a voltage distribution across the plurality of semiconductor switches may be actively balanced, even at very high switching frequencies. In this way, an operational performance and lifespan of the semiconductor switches may be increased relative to semiconductor switches of a power modulation device that does not include such an active voltage balancing system.

Figure 3:
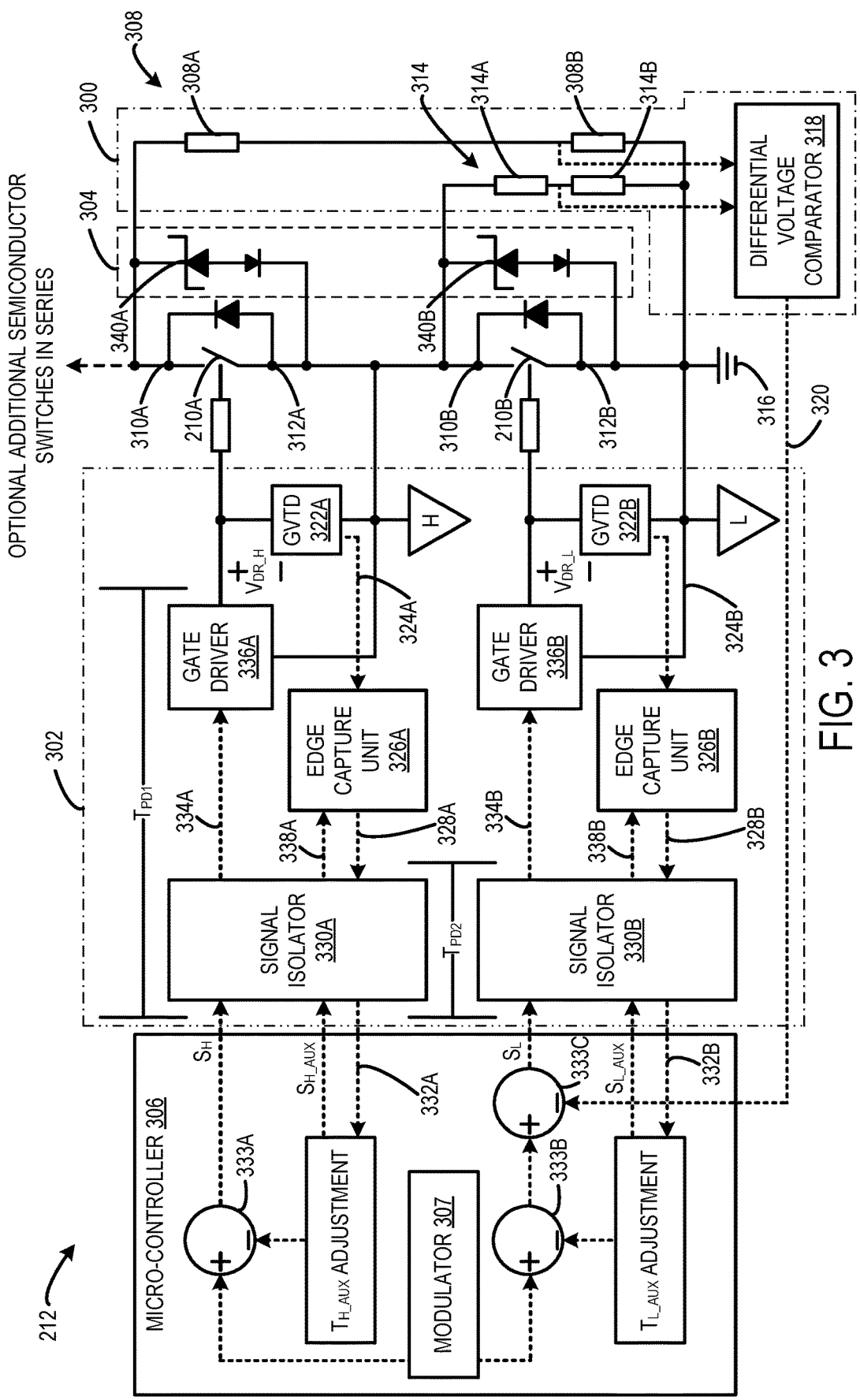
FIG. 3 is a circuit diagram schematically showing aspects of a power modulation device including a plurality of semiconductor switches and an active voltage balancing system configured to actively balance a voltage distribution across the plurality of semiconductor switches.

FIG. 3 is a circuit diagram showing a nonlimiting implementation of the electric drive system 200 of FIG. 2. In the depicted example, the active voltage balancing system 212 is configured to actively balance a voltage distribution across a first semiconductor switch 210A and a second semiconductor switch 210B electrically connected in series. It will be appreciated that the active voltage balancing system 212 may be configured to actively balance a voltage distribution across any suitable number of semiconductor switches electrically connected in series.

The active voltage balancing system 212 includes differential voltage logic 300 configured to detect a voltage difference between the first and second semiconductor switches 210A, 210B. The active voltage balancing system 212 further includes edge capture logic 302 configured to detect a time difference between when the first and second semiconductor switches 210A, 210B are switched. The active voltage balancing system 212 further includes protection logic 304 configured to protect the first and second semiconductor switches 210A, 210B from an over-voltage condition. The differential voltage logic 300, the edge capture logic 302, and the protection logic 304 may take any suitable form including any suitable arrangement of electrical components or hardware having equivalent functionality.

The active voltage balancing system 212 further includes a micro-controller 306 configured to control switching of the first and second semiconductor switches 210A, 210B to actively balance a voltage distribution across the semiconductor switches based on signals received from the differential voltage logic 300 and the edge capture logic 302. The micro-controller 306 may take any suitable form including different types of hardware, software, and/or firmware.

The differential voltage logic 300 includes a first resistor divider 308 including a first pair of resistors 308A, 308B in series electrically intermediate a source terminal 310A of the first semiconductor switch 210A and a drain terminal 312B of the second semiconductor switch 210B. The differential voltage logic 300 further includes a second resistor divider 314 including a second pair of resistors 314A, 314B in series electrically intermediate the source terminal 310B of the second semiconductor switch 210B and the drain terminal 312B of the second semiconductor switch 210B. The drain terminal 312B of the second semiconductor switch 210B is electrically connected to common ground 316. The resistors of the first and second resistor dividers 308, 314 are sized to sense the half voltage of the total drain-source voltage of the first and second semiconductor switches 210A, 210B and the drain-source voltage of the second semiconductor switch 210B.

The differential voltage logic 300 further includes a differential voltage comparator 318 that is configured to sense a half voltage of a drain-source voltage of the first and second semiconductor switches 210A, 210B across the first resistor divider 308 and sense a drain-source voltage of the second semiconductor switch 210B across the second resistor divider 314. The differential voltage comparator 318 is configured to output a differential voltage signal 320 to the micro-controller 306. The differential voltage signal 320 indicates a difference of the voltage across the first semiconductor switch 210A and the voltage across the second semiconductor switch 210B.

In embodiments that include more than two semiconductor switches in series, the differential voltage logic 300 may include additional sets of electrical components (e.g., resistor dividers, differential voltage comparators) corresponding to each additional semiconductor switch to detect a voltage across that semiconductor switch. Moreover, the arrangement of electrical components is provided as a non-limiting example and the differential voltage logic 300 may be configured to detect the voltage across the different semiconductor switches in any suitable manner.

The edge capture logic 302 includes a first gate-source voltage transient detector (GVTD) 322A configured to synthesize a first logic signal 324A corresponding to a change in a gate-source voltage of the first semiconductor switch 210A. The first logic signal 324A indicates a transient change in state of the first semiconductor switch 210A between an open state and a closed state. The first gate-source voltage transient detector 322A is configured to send the first logic signal 324A to a first gate voltage edge capture unit 326A. The first gate voltage edge capture unit 326A is configured to output a first timing signal 328A indicating a time when the first semiconductor switch 210A changes between the open state and the closed state based on the first logic signal 324A. A first signal isolator 330A is electrically intermediate the first gate voltage edge capture unit 326A and the micro-controller 306. The first signal isolator 330A is configured to filter the first timing signal 328A to provide a first filtered timing signal 332A to the micro-controller 306. The first signal isolator 330A is configured to electrically isolate the micro-controller 306 from the portion of the edge capture logic 302 that corresponds to the first semiconductor switch 210A.

The edge capture logic 302 further includes a second gate-source voltage transient detector (GVTD) 322B configured to synthesize a second logic signal 324B corresponding to a change in a gate-source voltage of the second semiconductor switch 210B. The second logic signal 324B indicates a transient change in state of the second semiconductor switch 210B between an open state and a closed state. The second gate-source voltage transient detector 322B is configured to send the second logic signal 324B to a second gate voltage edge capture unit 326B. The second gate voltage edge capture unit 326B is configured to output a second timing signal 328B indicating a time when the second semiconductor switch 210B changes between the open state and the closed state based on the second logic signal 324B. A second signal isolator 330B is electrically intermediate the second gate voltage edge capture unit 326B and the micro-controller 306. The second signal isolator 330B is configured to filter the second timing signal 328B to provide a second filtered timing signal 332B to the micro-controller 306. The second signal isolator 330B is configured to electrically isolate the micro-controller 306 from the portion of the edge capture logic 302 that corresponds to the second semiconductor switch 210B.

The micro-controller 306 is configured to output a first gate drive signal ($S_H$) to drive the first semiconductor switch 210A and a second gate drive signal ($S_L$) to drive the second semiconductor switch 210B to control switching of the switches. The first and second gate drive signals $S_H$, $S_L$ are pulse width modulated (PWM) signals. The micro-controller 306 includes a modulator 307 that is configured to output a first signal to a first summing box 333A. The first summing box 333A is configured to apply a timing adjustment to the first signal based on the first filtered timing signal 332A to generate the first gate drive signal $S_H$. The modulator 307 is configured to output a second signal to a second summing box 333B. The second summing box 333B is configured to apply a timing adjustment to the second signal based on the second filtered timing signal 332B. The output of the second summing box 333B is provided to a third summing box 333C. The third summing box 333C is configured to apply a voltage amplitude adjustment based on the differential voltage signal 320 to generate the second gate drive signal $S_L$. The illustrated configuration is provided as a non-limiting example. The micro-controller 306 may have any suitable configuration to provide such voltage balancing functionality.

The micro-controller 306 is configured to control the first and second gate voltage edge capture units 326A, 326B during each switching cycle of the semiconductor switches 210A, 210B. In particular, the micro-controller 306 is configured to output a first auxiliary drive signal ($S_{H\_AUX}$) at a same time that micro-controller 306 outputs the first gate drive signal $S_H$ and output a second auxiliary drive signal ($S_{L\_AUX}$) at a same time that the micro-controller 306 outputs the second gate drive signal $S_L$. Both the first gate drive signal $S_H$ and the first auxiliary drive signal $S_{H\_AUX}$ are filtered by the first signal isolator 330A to provide a first filtered gate drive signal 334A to a first gate driver 336A and a first filtered auxiliary drive signal 338A to the first gate voltage edge capture unit 326A. Both the first gate drive signal $S_H$ and the first auxiliary drive signal $S_{H\_AUX}$ are delayed by a time $T_{PD2}$. The first filtered auxiliary drive signal 338A activates the first gate voltage edge capture unit 326A. The first filtered gate drive signal 334A activates the first gate driver 336A to control switching of the first semiconductor switch 210A. A time between when the first gate drive signal $S_H$ is output by the micro-controller 306 and when the first gate driver 336A is activated is a time $T_{PD1}$ that is greater than the time $T_{PD2}$. When a gate voltage ($V_{DR\_H}$) of the first semiconductor switch 210A rises based on being driven by the first gate driver 336A, the first GVTD 322A detects the change in voltage and sends the first logic signal 324A to the first gate voltage edge capture unit 326A. Because the first gate voltage edge capture unit 326A is already activated based on receiving the first filtered auxiliary drive signal 338A, the first gate voltage edge capture unit 326A is able to capture the timing of the gate voltage change. The first gate voltage edge capture unit 326A sends this timing information back to the micro-controller 306 in the form of the first timing signal 328A, and then, the edge capture detector deactivates for the remainder of the switching cycle. The portion of the edge capture logic 302 corresponding to the second semiconductor switch 210B is controlled in the same manner as described above for each switching cycle of the second semiconductor switch 210B.

In embodiments that include more than two semiconductor switches in series, the edge capture logic 302 may include additional sets of electrical components (e.g., GVTD, edge capture detector, signal isolator, gate driver) corresponding to each additional semiconductor switch to detect a time difference between when that semiconductor switch is switched relative to the other semiconductor switches. Moreover, the arrangement of electrical components is provided as a non-limiting example and the edge capture logic 302 may be configured to detect a time difference between when the different semiconductor switches are switched in any suitable manner.

The protection logic 304 includes a first Zener diode 340A and a second Zener diode 340B. The first Zener diode 340A is electrically connected across a drain terminal 312A and a source terminal 310A of the first semiconductor switch 210A. The second Zener diode 340B is electrically connected across a drain terminal 312B and a source terminal 310B of the second semiconductor switch 210B. The first and second Zener diodes 340A, 340B are configured to, in the case of a severe voltage unbalancing, clamp an overvoltage to within a break-down voltage of the first and second series-connected semiconductor switches 210A, 210B to inhibit degradation of the switches.

The micro-controller 306 is configured to tune the first gate drive signal $S_H$ and the second gate drive signal $S_L$ based on the differential voltage signal 320 to compensate for a voltage imbalance between the first and second semiconductor switches 210A, 210B. For example, such a voltage imbalance may be due, at least in part, to different variances in physical parameters of the individual semiconductor switches as a result of manufacturing, circuit design, and/or environmental effects. The micro-controller 306 is further configured to tune the first gate drive signal $S_H$ and the second gate drive signal $S_L$ based on a difference in timing of the first and second filtered timing signals 332A, 332B to compensate for drive signal asymmetry between the first and second semiconductor switches 210A, 210B. The micro-controller 306 is configured to make adjustments to the first and second gate drive signals $S_H$ and $S_L$ for the next switching cycle based on the differential voltage signal 320 and the first and second filtered timing signals 332A, 332B received for the current switching cycle.

The micro-controller 306 may tune the first and second gate drive signals $S_H$, $S_L$ in any suitable manner based on the differential voltage signal 320 and the first and second filtered timing signals 332A, 332B. As one example, the micro-controller 306 is configured to advance a timing of the second gate drive signal $S_L$ relative to a timing of the first gate drive signal $S_H$ based on the drain-source voltage of the second semiconductor switch 210B being lower than the half voltage of the drain-source voltage of the first and second semiconductor switches during a turn-off transient of the first and second semiconductor switches 210A, 210B. The turn-off transient is initiated responsive to the gate voltages of the first and second semiconductor switches 210A, 210B falling based on signals received from the first and second gate drivers 336A, 336B.

As another example, the micro-controller 306 is configured to advance a timing of the first gate drive signal $S_H$ relative to a timing of the second gate drive signal $S_L$ based on a drain-source voltage of the first semiconductor switch 210A being lower than the half voltage of the drain-source voltage of the first and second semiconductor switches during a turn-off transient of the first and second semiconductor switches.

As yet another example, the micro-controller 306 is configured to advance a timing of the second gate drive signal $S_L$ relative to a timing of the first gate drive signal $S_H$ based on the drain-source voltage of the second semiconductor switch 210B being higher than the half voltage of the drain-source voltage of the first and second semiconductor switches during a turn-on transient of the first and second semiconductor switches. The turn-on transient is initiated responsive to the gate voltages of the first and second semiconductor switches 210A, 210B rising based on signals received from the first and second gate drivers 336A, 336B.

As still another example, the micro-controller 306 is configured to advance a timing of the first gate drive signal $S_H$ relative to a timing of the second gate drive signal $S_L$ based on the drain-source voltage of the first semiconductor switch 210A being higher than the half voltage of the drain-source voltage of the first and second semiconductor switches during a turn-on transient of the first and second semiconductor switches.

The above-described adjustments are provided as non-limiting examples that may be performed by the micro-controller 306 to tune the first and second gate drive signals to actively balance a voltage between the first and second semiconductor switches based on feedback in the form of the differential voltage signal and the difference in timing of the first and second timing signals. The micro-controller 306 may be configured to compensate for voltage imbalance and drive signal asymmetry in any suitable manner to balance a voltage between the first and second semiconductor switches.

Figure 4:
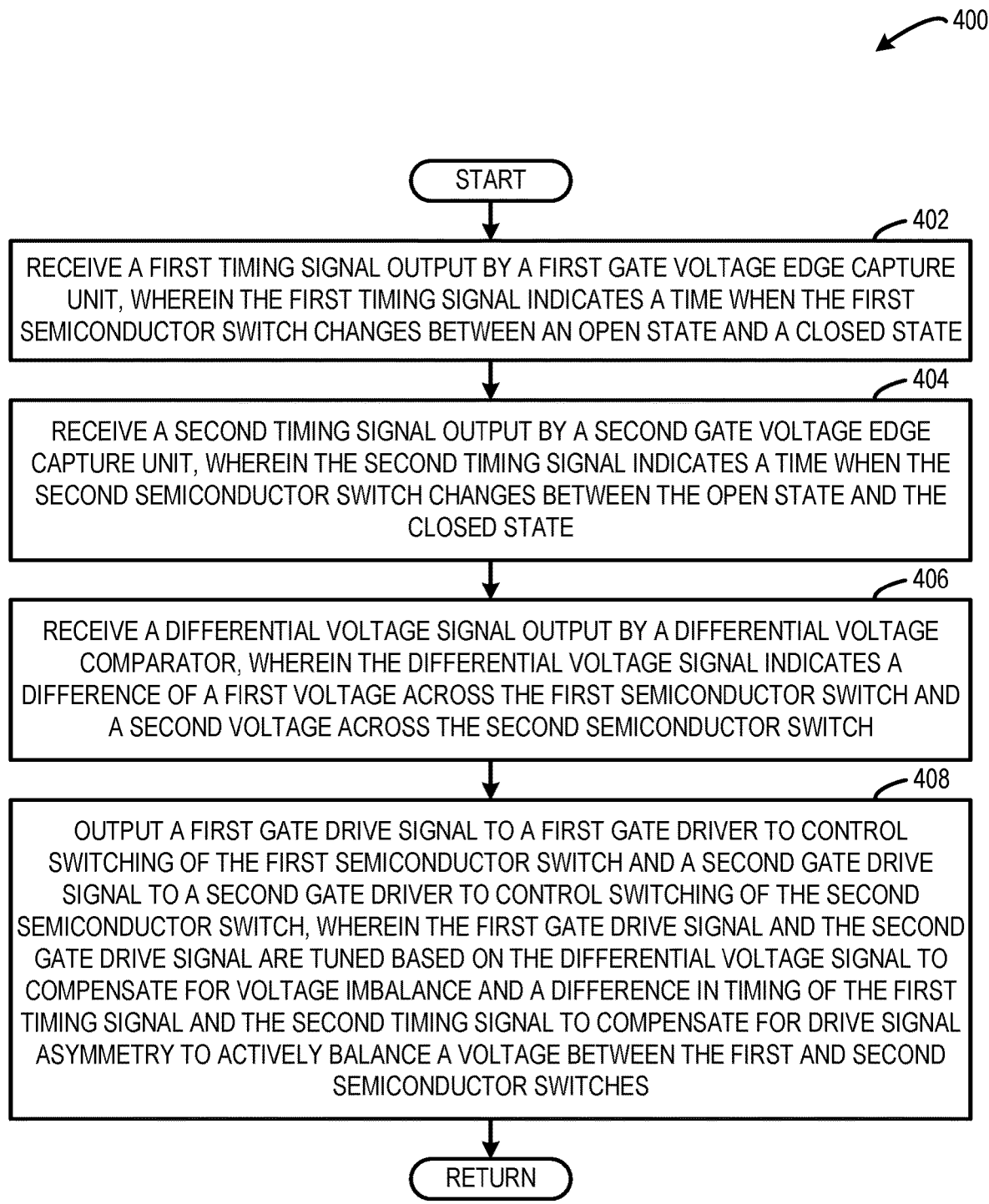
FIG. 4 is a flowchart showing an example method for actively balancing a voltage distribution across a plurality of semiconductor switches in series in a power modulation device.

FIG. 4 is a flowchart of an example method 400 for actively balancing a voltage distribution across a plurality of semiconductor switches in series in a power modulation device. For example, method 400 may be performed by the micro-controller 306 of the active voltage balancing system 212 to actively balance voltage across first and second semiconductors 210A, 210B shown in FIGS. 2-3. At 402, the method 400 includes receiving a first timing signal output by a first gate voltage edge capture unit, wherein the first timing signal indicates a time when the first semiconductor switch changes between an open state and a closed state. At 404, the method 400 includes receiving a second timing signal output by a second gate voltage edge capture unit, wherein the second timing signal indicates a time when the second semiconductor switch changes between the open state and the closed state. At 406, the method 400 includes receiving a differential voltage signal output by a differential voltage comparator, wherein the differential voltage signal indicates a difference of a first voltage across the first semiconductor switch and a second voltage across the second semiconductor switch. At 408, the method 400 includes outputting a first gate drive signal to a first gate driver to control switching of the first semiconductor switch and outputting a second gate drive signal to a second gate driver to control switching of the second semiconductor switch. The first gate drive signal and the second gate drive signal are tuned based on the differential voltage signal to compensate for voltage imbalance and a difference in timing of the first timing signal and the second timing signal to compensate for drive signal asymmetry to actively balance a voltage between the first and second semiconductor switches.

Figure 5:
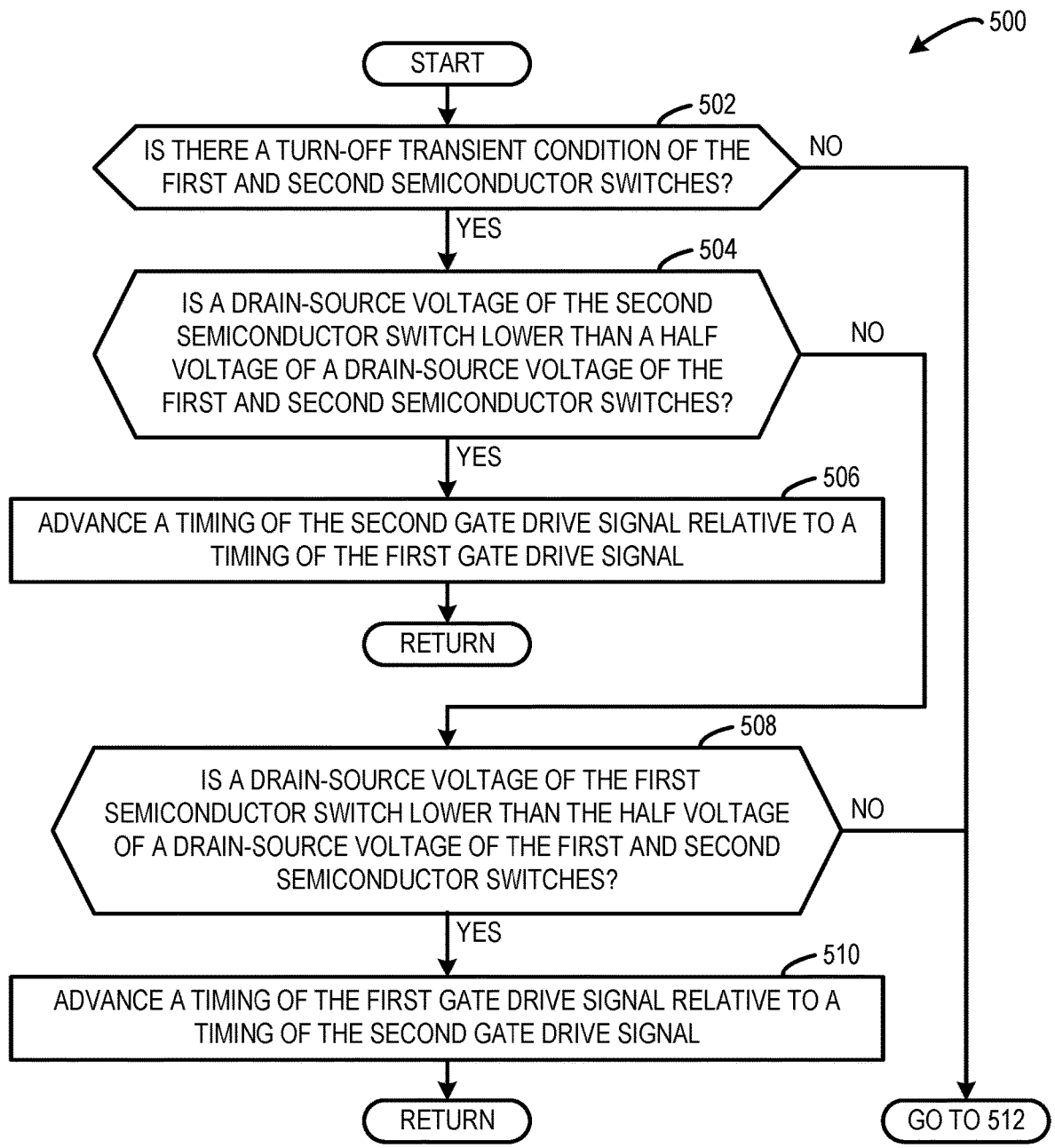
FIGS. 5 and 6 are flowcharts showing an example method for adjusting a timing of gate drive signals for driving a plurality of semiconductor switches to actively balance a voltage distribution across the plurality of semiconductor switches.
Figure 6:
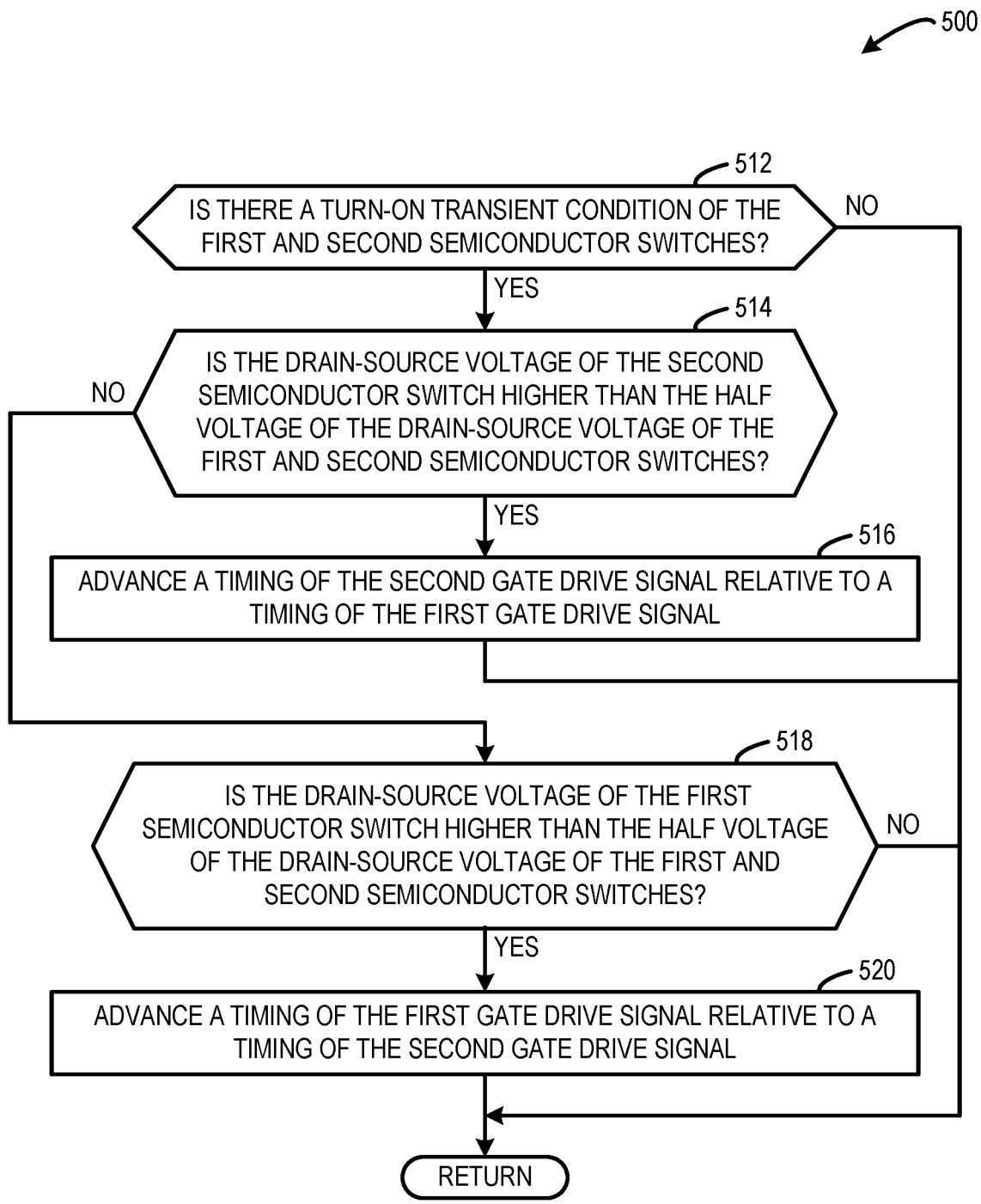

FIGS. 5 and 6 are flowcharts showing an example method 500 for tuning the first and second gate drive signals to actively balance the voltage distribution across the plurality of semiconductor switches. For example, method 500 may be performed by the micro-controller 306 of the active voltage balancing system 212 to actively balance voltage across first and second semiconductors 210A, 210B shown in FIGS. 2-3. At 502, the method 500 includes determining whether there is a turn-off transient condition of the first and second semiconductor switches. For example, the turn-off transient condition may occur when the gate voltages of the semiconductor switches go from high to low. If it is determined that there is a turn-off transient condition, then the method 500 moves to 504. Otherwise, the method 500 moves to 512. At 504, the method 500 includes determining whether a drain-source voltage of the second semiconductor switch is lower than a half voltage of the drain-source voltage of the first and second semiconductor switches. If the drain-source voltage of the second semiconductor switch is lower than the half voltage of the drain-source voltage of the first and second semiconductor switches, the method 500 moves to 506. Otherwise, the method 500 moves to 508. At 506, the method 500 includes advancing a timing of the second gate drive signal relative to a timing of the first gate drive signal for the next switching cycle to actively balance the voltage across the first and second semiconductor switches. At 508, the method 500 includes determining whether a drain-source voltage of the first semiconductor switch is lower than the half voltage of the drain-source voltage of the first and second semiconductor switches. If the drain-source voltage of the first semiconductor switch is lower than the half voltage of the drain-source voltage of the first and second semiconductor switches, then the method 500 moves to 510. Otherwise, the method 500 moves to 512. At 510, the method 500 includes advancing a timing of the first gate drive signal relative to a timing of the second gate drive signal for the next switching cycle to actively balance the voltage across the first and second semiconductor switches. As shown at 512 of FIG. 6, the method 500 includes determining whether there is a turn-on transient condition of the first and second semiconductor switches. For example, the turn-on transient condition may occur when the gate voltages of the semiconductor switches go from low to high. If it is determined that there is a turn-on transient condition, then the method 500 moves to 514. Otherwise, the method 500 returns. At 514, the method 500 includes determining whether the drain-source voltage of the second semiconductor switch is higher than the half voltage of the drain-source voltage of the first and second semiconductor switches. If the drain-source voltage of the second semiconductor switch is higher than the half voltage of the drain-source voltage of the first and second semiconductor switches, then the method 500 moves to 516. Otherwise, the method 500 moves to 518. At 516, the method 500 includes advancing a timing of the second gate drive signal relative to a timing of the first gate drive signal for the next switching cycle to actively balance the voltage across the first and second semiconductor switches. At 518, the method 500 includes determining whether the drain-source voltage of the first semiconductor switch is higher than the half voltage of the drain-source voltage of the first and second semiconductor switches. If the drain-source voltage of the first semiconductor switch is higher than the half voltage of the drain-source voltage of the first and second semiconductor switches, then the method 500 moves to 520. Otherwise, the method 500 returns. At 520, the method 500 includes advancing a timing of the first gate drive signal relative to a timing of the second gate drive signal for the next switching cycle to actively balance the voltage across the first and second semiconductor switches.

The above described methods may be performed to tune the first and second gate drive signals to compensate for voltage imbalance and drive signal asymmetry to actively balance a voltage between the first and second semiconductor switches. The method may be expanded to actively balance voltage between any suitable number of semiconductor switches connected in series in a power modulation device. The specific methods described herein may represent one or more of any number of processing strategies such as event-driven, interrupt-driven, multi-tasking, multi-threading, and the like. As such, various actions, operations, and/or functions illustrated may be performed in the sequence illustrated, in parallel, or in some cases omitted. Likewise, the order of processing is not necessarily required to achieve the features and advantages of the example embodiments described herein, but is provided for ease of illustration and description. One or more of the illustrated actions, operations, and/or functions may be repeatedly performed depending on the particular strategy being used.

FIGS. 7A-7D are graphs showing semiconductor switching with and without the active voltage balancing techniques described herein. FIG. 7A shows an example turn-off transient condition where the gate voltages of first and second semiconductor switches transition from high to low without active voltage balancing employed. In this example, the voltage of the first semiconductor switch is greater than the voltage of the second semiconductor switch during the turn-off transient causing a voltage imbalance between the first and second semiconductor switches. FIG. 7B shows an example turn-off transient condition where active voltage balancing is employed. For example, such active voltage balancing may be performed by the active voltage balancing system 212 shown in FIGS. 2 and 3 using the active voltage balancing methods 400 shown in FIGS. 4 and 500 shown in FIGS. 5 and 6 to actively balance voltage between the first and second semiconductor switches. In this example, the voltages of the first and second semiconductor switches are balanced during the turn-off transient condition such that a voltage difference between the voltages across the individual switches is reduced and a time difference between when the semiconductors switch from the on state to the off state is reduced relative to the turn-off transient shown in FIG. 7A where such active voltage balancing techniques are not employed.

FIG. 7C shows an example turn-on transient condition where the gate voltages of the first and second semiconductor switches transition from low to high without active voltage balancing employed. In this example, the voltage of the first semiconductor switch is greater than the voltage of the second semiconductor switch during the turn-on transient causing a voltage imbalance between the first and second semiconductor switches. FIG. 7D shows an example turn-on transient condition where active voltage balancing is employed. For example, such active voltage balancing may be performed by the active voltage balancing system 212 shown in FIGS. 2 and 3 using the active voltage balancing methods 400 shown in FIGS. 4 and 500 shown in FIGS. 5 and 6 to actively balance voltage between the first and second semiconductor switches. In this example, the voltages of the first and second semiconductor switches are balanced during the turn-on transient condition such that a voltage difference between the voltages across the individual switches is reduced and a time difference between when the semiconductors switch from the on state to the off state is reduced relative to the turn-off transient shown in FIG. 7C where such active voltage balancing techniques are not employed.

In an example, a system comprises a power modulation device including a first semiconductor switch and a second semiconductor switch in series with the first semiconductor switch, and an active voltage balancing system including a first gate driver configured to control switching of the first semiconductor switch between an open state and a closed state, a second gate driver configured to control switching of the second semiconductor switch between an open state and a closed state, a first gate voltage edge capture unit configured to output a first timing signal indicating a time when the first semiconductor switch changes between the open state and the closed state, a second gate voltage edge capture unit configured to output a second timing signal indicating a time when the second semiconductor switch changes between the open state and the closed state, a differential voltage comparator configured to output a differential voltage signal indicating a difference of a first voltage across the first semiconductor switch and a second voltage across the second semiconductor switch, and a micro-controller configured to receive the first timing signal output by the first gate voltage edge capture unit, receive the second timing signal output by the second gate voltage edge capture unit, receive the differential voltage signal output by the differential voltage comparator, output a first gate drive signal to the first gate driver to control switching of the first semiconductor switch, and output a second gate drive signal to the second gate driver to control switching of the second semiconductor switch, wherein the micro-controller is further configured to tune the first gate drive signal and the second gate drive signal based on the differential voltage signal to compensate for voltage imbalance and a difference in timing of the first timing signal and the second timing signal to compensate for drive signal asymmetry to actively balance a voltage between the first and second semiconductor switches. In this example and/or other examples, the system may further comprise a first Zener diode electrically intermediate a source terminal and a drain terminal of the first semiconductor switch, and a second Zener diode electrically intermediate a source terminal and a drain terminal of the second semiconductor switch. In this example and/or other examples, the differential voltage comparator may include a first resistor divider including a first pair of resistors in series electrically intermediate a source terminal of the first semiconductor switch and a drain terminal of the second semiconductor switch, and a second resistor divider including a second pair of resistors in series electrically intermediate a source terminal of the second semiconductor switch and the drain terminal of the second semiconductor switch, the drain terminal of the second semiconductor switch may be electrically connected to common ground, and the differential voltage comparator may be configured to sense a half voltage of a drain-source voltage of the first and second semiconductor switches across the first resistor divider as the first voltage, and a drain-source voltage of the second semiconductor switch across the second resistor divider as the second voltage. In this example and/or other examples, the micro-controller may be further configured to advance a timing of the second gate drive signal relative to a timing of the first gate drive signal based on the drain-source voltage of the second semiconductor switch being lower than the half voltage of the drain-source voltage of the first and second semiconductor switches during a turn-off transient of the first and second semiconductor switches. In this example and/or other examples, the micro-controller may be further configured to advance a timing of the first gate drive signal relative to a timing of the second gate drive signal based on a drain-source voltage of the first semiconductor switch being lower than the half voltage of the drain-source voltage of the first and second semiconductor switches during a turn-off transient of the first and second semiconductor switches. In this example and/or other examples, the micro-controller may be further configured to advance a timing of the second gate drive signal relative to a timing of the first gate drive signal based on the drain-source voltage of the second semiconductor switch being higher than the half voltage of the drain-source voltage of the first and second semiconductor switches during a turn-on transient of the first and second semiconductor switches. In this example and/or other examples, the micro-controller may be further configured to advance a timing of the first gate drive signal relative to a timing of the second gate drive signal based on the drain-source voltage of the first semiconductor switch being higher than the half voltage of the drain-source voltage of the first and second semiconductor switches during a turn-on transient of the first and second semiconductor switches. In this example and/or other examples, the system may further comprise a first gate-source voltage transient detector configured to synthesize a first logic signal corresponding to a change in a gate-source voltage of the first semiconductor switch and send the first logic signal to the first gate voltage edge capture unit, the first gate voltage edge capture unit may be configured to generate the first timing signal based on the first logic signal, and a second gate-source voltage transient detector configured to synthesize a second logic signal corresponding to a change in a gate-source voltage of the second semiconductor switch and send the second logic signal to the second gate voltage edge capture unit, the second gate voltage edge capture unit may be configured to generate the second timing signal based on the second logic signal. In this example and/or other examples, the micro-controller may be further configured to output a first auxiliary drive signal to the first gate voltage edge capture unit at a same time that the first gate drive signal is output from the micro-controller, the first gate voltage edge capture unit may be configured to activate based on receiving the first auxiliary drive signal, and output a second auxiliary drive signal to the second gate voltage edge capture unit at a same time that the second gate drive signal is output from the micro-controller, the second gate voltage edge capture unit may be configured to activate based on receiving the second auxiliary drive signal. In this example and/or other examples, the system may further comprise a first signal isolator electrically intermediate the first gate voltage edge capture unit and the micro-controller and electrically intermediate the first gate driver and the micro-controller, the first signal isolator may be configured to filter the first timing signal output by the first gate voltage edge capture unit to provide a first filtered timing signal to the micro-controller, filter the first gate drive signal output by the micro-controller to provide a first filtered gate drive signal to the first gate driver, and filter the first auxiliary drive signal output by the micro-controller to provide a first filtered auxiliary drive signal to the first gate voltage edge capture unit, and a second signal isolator electrically intermediate the second gate voltage edge capture unit and the micro-controller and electrically intermediate the second gate driver and the micro-controller, the second signal isolator may be configured to filter the second timing signal output by the second gate voltage edge capture unit to provide a second filtered timing signal to the micro-controller, filter the second gate drive signal output by the micro-controller to provide a second filtered gate drive signal to the second gate driver, and filter the second auxiliary drive signal output by the micro-controller to provide a second filtered auxiliary drive signal to the second gate voltage edge capture unit.

In an example, an active voltage balancing method for controlling a plurality of semiconductor switches including at least first and second semiconductor switches in series in a power modulation device comprises receiving a first timing signal output by a first gate voltage edge capture unit, wherein the first timing signal indicates a time when the first semiconductor switch changes between an open state and a closed state, receiving a second timing signal output by a second gate voltage edge capture unit, wherein the second timing signal indicates a time when the second semiconductor switch changes between the open state and the closed state, receiving a differential voltage signal output by a differential voltage comparator, wherein the differential voltage signal indicates a difference of a first voltage across the first semiconductor switch and a second voltage across the second semiconductor switch, outputting a first gate drive signal to a first gate driver to control switching of the first semiconductor switch, and outputting a second gate drive signal to a second gate driver to control switching of the second semiconductor switch, the first gate drive signal and the second gate drive signal are tuned based on the differential voltage signal to compensate for voltage imbalance and a difference in timing of the first timing signal and the second timing signal to compensate for drive signal asymmetry to actively balance a voltage between the first and second semiconductor switches. In this example and/or other examples, the active voltage balancing method may further comprise advancing a timing of the second gate drive signal relative to a timing of the first gate drive signal based on a drain-source voltage of the second semiconductor switch being lower than a half voltage of a drain-source voltage of the first and second semiconductor switches during a turn-off transient of the first and second semiconductor switches. In this example and/or other examples, the active voltage balancing method may further comprise advancing a timing of the first gate drive signal relative to a timing of the second gate drive signal based on a drain-source voltage of the first semiconductor switch being lower than a half voltage of a drain-source voltage of the first and second semiconductor switches during a turn-off transient of the first and second semiconductor switches. In this example and/or other examples, the active voltage balancing method may further comprise advancing a timing of the second gate drive signal relative to a timing of the first gate drive signal based on a drain-source voltage of the second semiconductor switch being higher than a half voltage of a drain-source voltage of the first and second semiconductor switches during a turn-on transient of the first and second semiconductor switches. In this example and/or other examples, the active voltage balancing method may further comprise advancing a timing of the first gate drive signal relative to a timing of the second gate drive signal based on a drain-source voltage of the first semiconductor switch being higher than a half voltage of a drain-source voltage of the first and second semiconductor switches during a turn-on transient of the first and second semiconductor switches.

In an example, a system comprises a power modulation device including a first semiconductor switch and a second semiconductor switch in series with the first semiconductor switch, and an active voltage balancing system including a first Zener diode electrically intermediate a source terminal and a drain terminal of the first semiconductor switch, a second Zener diode electrically intermediate a source terminal and a drain terminal of the second semiconductor switch, a first gate driver configured to control switching of the first semiconductor switch between an open state and a closed state, a second gate driver configured to control switching of the semiconductor switch between an open state and a closed state, a first gate voltage edge capture unit configured to output a first timing signal indicating a time when the first semiconductor switch changes between the open state and the closed state, a second gate voltage edge capture unit configured to output a second timing signal indicating a time when the second semiconductor switch changes between the open state and the closed state, a differential voltage comparator configured to output a differential voltage signal indicating a difference of a first voltage across the first semiconductor switch and a second voltage across the second semiconductor switch, and a micro-controller configured to receive the first timing signal output by the first gate voltage edge capture unit, receive the second timing signal output by the second gate voltage edge capture unit, receive the differential voltage signal output by the differential voltage comparator, output a first gate drive signal to the first gate driver to control switching of the first semiconductor switch, and output a second gate drive signal to the second gate driver to control switching of the second semiconductor switch, the micro-controller is further configured to tune the first gate drive signal and the second gate drive signal to compensate for voltage imbalance based on the differential voltage signal and a difference in timing of the first timing signal and the second timing signal to compensate for drive signal asymmetry to actively balance a voltage between the first and second semiconductor switches. In this example and/or other examples, the differential voltage comparator may include a first resistor divider including a first pair of resistors in series electrically intermediate a source terminal of the first semiconductor switch and a drain terminal of the second semiconductor switch, and a second resistor divider including a second pair of resistors in series electrically intermediate a source terminal of the second semiconductor switch and the drain terminal of the second semiconductor switch, the drain terminal of the second semiconductor switch may be connected to a common ground, and the differential voltage comparator may be configured to sense a half voltage of a drain-source voltage of the first and second semiconductor switches across the first resistor divider as the first voltage, and a drain-source voltage of the second semiconductor switch across the second resistor divider as the second voltage. In this example and/or other examples, the system may further comprise a first gate-source voltage transient detector configured to synthesize a first logic signal corresponding to a change in a gate-source voltage of the first semiconductor switch and send the first logic signal to the first gate voltage edge capture unit, the first gate voltage edge capture unit may be configured to generate the first timing signal based on the first logic signal, and a second gate-source voltage transient detector configured to synthesize a second logic signal corresponding to a change in a gate-source voltage of the second semiconductor switch and send the second logic signal to the second gate voltage edge capture unit, the second gate voltage edge capture unit may be configured to generate the second timing signal based on the second logic signal. In this example and/or other examples, the micro-controller may be further configured to output a first auxiliary drive signal to the first gate voltage edge capture unit at a same time that the first gate drive signal is output from the micro-controller, the first gate voltage edge capture unit may be configured to activate based on receiving the first auxiliary drive signal, and output a second auxiliary drive signal to the second gate voltage edge capture unit at a same time that the second gate drive signal is output from the micro-controller, the second gate voltage edge capture unit may be configured to activate based on receiving the second auxiliary drive signal. In this example and/or other examples, the system may further comprise a first signal isolator electrically intermediate the first gate voltage edge capture unit and the micro-controller and electrically intermediate the first gate driver and the micro-controller, the first signal isolator may be configured to filter the first timing signal output by the first gate voltage edge capture unit to provide a first filtered timing signal to the micro-controller, filter the first gate drive signal output by the micro-controller to provide a first filtered gate drive signal to the first gate driver, and filter the first auxiliary drive signal output by the micro-controller to provide a first filtered auxiliary drive signal to the first gate voltage edge capture unit, and a second signal isolator electrically intermediate the second gate voltage edge capture unit and the micro-controller and electrically intermediate the second gate driver and the micro-controller, the second signal isolator may be configured to filter the second timing signal output by the second gate voltage edge capture unit to provide a second filtered timing signal to the micro-controller, filter the second gate drive signal output by the micro-controller to provide a second filtered gate drive signal to the second gate driver, and filter the second auxiliary drive signal output by the micro-controller to provide a second filtered auxiliary drive signal to the second gate voltage edge capture unit.

The present disclosure includes all novel and non-obvious combinations and subcombinations of the various features and techniques disclosed herein. The various features and techniques disclosed herein are not necessarily required of all examples of the present disclosure. Furthermore, the various features and techniques disclosed herein may define patentable subject matter apart from the disclosed examples and may find utility in other implementations not expressly disclosed herein.

The invention claimed is:

1. A system comprising:
a power modulation device including:
a first semiconductor switch; and
a second semiconductor switch in series with the first semiconductor switch; and
an active voltage balancing system including:
a first gate driver configured to control switching of the first semiconductor switch between an open state and a closed state;
a second gate driver configured to control switching of the second semiconductor switch between an open state and a closed state;
a first gate voltage edge capture unit configured to output a first timing signal indicating a time when the first semiconductor switch changes between the open state and the closed state;
a second gate voltage edge capture unit configured to output a second timing signal indicating a time when the second semiconductor switch changes between the open state and the closed state;
a differential voltage comparator configured to output a differential voltage signal indicating a difference of a first voltage across the first semiconductor switch and a second voltage across the second semiconductor switch; and
a micro-controller configured to:
receive the first timing signal output by the first gate voltage edge capture unit;
receive the second timing signal output by the second gate voltage edge capture unit;
receive the differential voltage signal output by the differential voltage comparator;
output a first gate drive signal to the first gate driver to control switching of the first semiconductor switch; and
output a second gate drive signal to the second gate driver to control switching of the second semiconductor switch,
wherein the micro-controller is further configured to tune the first gate drive signal and the second gate drive signal based on the differential voltage signal to compensate for voltage imbalance and a difference in timing of the first timing signal and the second timing signal to compensate for drive signal asymmetry to actively balance a voltage between the first and second semiconductor switches.

2. The system of claim 1, further comprising:
a first Zener diode electrically intermediate a source terminal and a drain terminal of the first semiconductor switch; and
a second Zener diode electrically intermediate a source terminal and a drain terminal of the second semiconductor switch.

3. The system of claim 1, wherein the differential voltage comparator includes:
a first resistor divider including a first pair of resistors in series electrically intermediate a source terminal of the first semiconductor switch and a drain terminal of the second semiconductor switch; and
a second resistor divider including a second pair of resistors in series electrically intermediate a source terminal of the second semiconductor switch and the drain terminal of the second semiconductor switch,
wherein the drain terminal of the second semiconductor switch is electrically connected to common ground, and
wherein the differential voltage comparator is configured to sense:
a half voltage of a drain-source voltage of the first and second semiconductor switches across the first resistor divider as the first voltage; and
a drain-source voltage of the second semiconductor switch across the second resistor divider as the second voltage.

4. The system of claim 3, wherein the micro-controller is further configured to advance a timing of the second gate drive signal relative to a timing of the first gate drive signal based on the drain-source voltage of the second semiconductor switch being lower than the half voltage of the drain-source voltage of the first and second semiconductor switches during a turn-off transient of the first and second semiconductor switches.

5. The system of claim 3, wherein the micro-controller is further configured to advance a timing of the first gate drive signal relative to a timing of the second gate drive signal based on a drain-source voltage of the first semiconductor switch being lower than the half voltage of the drain-source voltage of the first and second semiconductor switches during a turn-off transient of the first and second semiconductor switches.

6. The system of claim 3, wherein the micro-controller is further configured to advance a timing of the second gate drive signal relative to a timing of the first gate drive signal based on the drain-source voltage of the second semiconductor switch being higher than the half voltage of the drain-source voltage of the first and second semiconductor switches during a turn-on transient of the first and second semiconductor switches.

7. The system of claim 3, wherein the micro-controller is further configured to advance a timing of the first gate drive signal relative to a timing of the second gate drive signal based on the drain-source voltage of the first semiconductor switch being higher than the half voltage of the drain-source voltage of the first and second semiconductor switches during a turn-on transient of the first and second semiconductor switches.

8. The system of claim 1, further comprising:
a first gate-source voltage transient detector configured to synthesize a first logic signal corresponding to a change in a gate-source voltage of the first semiconductor switch and send the first logic signal to the first gate voltage edge capture unit, wherein the first gate voltage edge capture unit is configured to generate the first timing signal based on the first logic signal; and
a second gate-source voltage transient detector configured to synthesize a second logic signal corresponding to a change in a gate-source voltage of the second semiconductor switch and send the second logic signal to the second gate voltage edge capture unit, wherein the second gate voltage edge capture unit is configured to generate the second timing signal based on the second logic signal.

9. The system of claim 8, wherein the micro-controller is further configured to:
output a first auxiliary drive signal to the first gate voltage edge capture unit at a same time that the first gate drive signal is output from the micro-controller, wherein the first gate voltage edge capture unit is configured to activate based on receiving the first auxiliary drive signal; and
output a second auxiliary drive signal to the second gate voltage edge capture unit at a same time that the second gate drive signal is output from the micro-controller, wherein the second gate voltage edge capture unit is configured to activate based on receiving the second auxiliary drive signal.

10. The system of claim 9, further comprising:
a first signal isolator electrically intermediate the first gate voltage edge capture unit and the micro-controller and electrically intermediate the first gate driver and the micro-controller, wherein the first signal isolator is configured to filter the first timing signal output by the first gate voltage edge capture unit to provide a first filtered timing signal to the micro-controller, filter the first gate drive signal output by the micro-controller to provide a first filtered gate drive signal to the first gate driver, and filter the first auxiliary drive signal output by the micro-controller to provide a first filtered auxiliary drive signal to the first gate voltage edge capture unit; and
a second signal isolator electrically intermediate the second gate voltage edge capture unit and the micro-controller and electrically intermediate the second gate driver and the micro-controller, wherein the second signal isolator is configured to filter the second timing signal output by the second gate voltage edge capture unit to provide a second filtered timing signal to the micro-controller, filter the second gate drive signal output by the micro-controller to provide a second filtered gate drive signal to the second gate driver, and filter the second auxiliary drive signal output by the micro-controller to provide a second filtered auxiliary drive signal to the second gate voltage edge capture unit.

11. An active voltage balancing method for controlling a plurality of semiconductor switches including at least first and second semiconductor switches in series in a power modulation device, the active voltage balancing method comprising:
receiving a first timing signal output by a first gate voltage edge capture unit, wherein the first timing signal indicates a time when the first semiconductor switch changes between an open state and a closed state;
receiving a second timing signal output by a second gate voltage edge capture unit, wherein the second timing signal indicates a time when the second semiconductor switch changes between the open state and the closed state;
receiving a differential voltage signal output by a differential voltage comparator, wherein the differential voltage signal indicates a difference of a first voltage across the first semiconductor switch and a second voltage across the second semiconductor switch;
outputting a first gate drive signal to a first gate driver to control switching of the first semiconductor switch, and
outputting a second gate drive signal to a second gate driver to control switching of the second semiconductor switch,
wherein the first gate drive signal and the second gate drive signal are tuned based on the differential voltage signal to compensate for voltage imbalance and a difference in timing of the first timing signal and the second timing signal to compensate for drive signal asymmetry to actively balance a voltage between the first and second semiconductor switches.

12. The active voltage balancing method of claim 11, further comprising:
advancing a timing of the second gate drive signal relative to a timing of the first gate drive signal based on a drain-source voltage of the second semiconductor switch being lower than a half voltage of a drain-source voltage of the first and second semiconductor switches during a turn-off transient of the first and second semiconductor switches.

13. The active voltage balancing method of claim 11, further comprising:
advancing a timing of the first gate drive signal relative to a timing of the second gate drive signal based on a drain-source voltage of the first semiconductor switch being lower than a half voltage of a drain-source voltage of the first and second semiconductor switches during a turn-off transient of the first and second semiconductor switches.

14. The active voltage balancing method of claim 11, further comprising:
advancing a timing of the second gate drive signal relative to a timing of the first gate drive signal based on a drain-source voltage of the second semiconductor switch being higher than a half voltage of a drain-source voltage of the first and second semiconductor switches during a turn-on transient of the first and second semiconductor switches.

15. The active voltage balancing method of claim 11, further comprising:
advancing a timing of the first gate drive signal relative to a timing of the second gate drive signal based on a drain-source voltage of the first semiconductor switch being higher than a half voltage of a drain-source voltage of the first and second semiconductor switches during a turn-on transient of the first and second semiconductor switches.

16. A system comprising:
a power modulation device including:

a first semiconductor switch; and
a second semiconductor switch in series with the first semiconductor switch; and
an active voltage balancing system including:
a first Zener diode electrically intermediate a source terminal and a drain terminal of the first semiconductor switch;
a second Zener diode electrically intermediate a source terminal and a drain terminal of the second semiconductor switch;
a first gate driver configured to control switching of the first semiconductor switch between an open state and a closed state;
a second gate driver configured to control switching of the second semiconductor switch between an open state and a closed state;
a first gate voltage edge capture unit configured to output a first timing signal indicating a time when the first semiconductor switch changes between the open state and the closed state;
a second gate voltage edge capture unit configured to output a second timing signal indicating a time when the second semiconductor switch changes between the open state and the closed state;
a differential voltage comparator configured to output a differential voltage signal indicating a difference of a first voltage across the first semiconductor switch and a second voltage across the second semiconductor switch; and
a micro-controller configured to:
receive the first timing signal output by the first gate voltage edge capture unit;
receive the second timing signal output by the second gate voltage edge capture unit;
receive the differential voltage signal output by the differential voltage comparator;
output a first gate drive signal to the first gate driver to control switching of the first semiconductor switch; and
output a second gate drive signal to the second gate driver to control switching of the second semiconductor switch,
wherein the micro-controller is further configured to tune the first gate drive signal and the second gate drive signal to compensate for voltage imbalance based on the differential voltage signal and a difference in timing of the first timing signal and the second timing signal to compensate for drive signal asymmetry to actively balance a voltage between the first and second semiconductor switches.

17. The system of claim 16, wherein the differential voltage comparator includes:
a first resistor divider including a first pair of resistors in series electrically intermediate a source terminal of the first semiconductor switch and a drain terminal of the second semiconductor switch; and
a second resistor divider including a second pair of resistors in series electrically intermediate a source terminal of the second semiconductor switch and the drain terminal of the second semiconductor switch,
wherein the drain terminal of the second semiconductor switch is connected to a common ground, and
wherein the differential voltage comparator is configured to sense:
a half voltage of a drain-source voltage of the first and second semiconductor switches across the first resistor divider as the first voltage; and
a drain-source voltage of the second semiconductor switch across the second resistor divider as the second voltage.

18. The system of claim 16, further comprising:
a first gate-source voltage transient detector configured to synthesize a first logic signal corresponding to a change in a gate-source voltage of the first semiconductor switch and send the first logic signal to the first gate voltage edge capture unit, wherein the first gate voltage edge capture unit is configured to generate the first timing signal based on the first logic signal; and
a second gate-source voltage transient detector configured to synthesize a second logic signal corresponding to a change in a gate-source voltage of the second semiconductor switch and send the second logic signal to the second gate voltage edge capture unit, wherein the second gate voltage edge capture unit is configured to generate the second timing signal based on the second logic signal.

19. The system of claim 16, wherein the micro-controller is further configured to:
output a first auxiliary drive signal to the first gate voltage edge capture unit at a same time that the first gate drive signal is output from the micro-controller, wherein the first gate voltage edge capture unit is configured to activate based on receiving the first auxiliary drive signal; and
output a second auxiliary drive signal to the second gate voltage edge capture unit at a same time that the second gate drive signal is output from the micro-controller, wherein the second gate voltage edge capture unit is configured to activate based on receiving the second auxiliary drive signal.

20. The system of claim 19, further comprising:
a first signal isolator electrically intermediate the first gate voltage edge capture unit and the micro-controller and electrically intermediate the first gate driver and the micro-controller, wherein the first signal isolator is configured to filter the first timing signal output by the first gate voltage edge capture unit to provide a first filtered timing signal to the micro-controller, filter the first gate drive signal output by the micro-controller to provide a first filtered gate drive signal to the first gate driver, and filter the first auxiliary drive signal output by the micro-controller to provide a first filtered auxiliary drive signal to the first gate voltage edge capture unit; and
a second signal isolator electrically intermediate the second gate voltage edge capture unit and the micro-controller and electrically intermediate the second gate driver and the micro-controller, wherein the second signal isolator is configured to filter the second timing signal output by the second gate voltage edge capture unit to provide a second filtered timing signal to the micro-controller, filter the second gate drive signal output by the micro-controller to provide a second filtered gate drive signal to the second gate driver, and filter the second auxiliary drive signal output by the micro-controller to provide a second filtered auxiliary drive signal to the second gate voltage edge capture unit.

* * * * *